United States Patent
Chang et al.

(10) Patent No.: US 9,136,301 B2
(45) Date of Patent: Sep. 15, 2015

(54) MULTI-WAVE BAND LIGHT SENSOR COMBINED WITH FUNCTION OF IR SENSING AND METHOD OF FABRICATING THE SAME

(71) Applicant: Maxchip Electronics Corp., Hsinchu (TW)

(72) Inventors: Jin-Wei Chang, Taoyuan County (TW); Hung-Lung Wang, Taoyuan County (TW); Jung-Kai Hung, Tainan (TW)

(73) Assignee: Maxchip Electronics Corp., Hsinchu (TW)

( * ) Notice: Subject to any disclaimer, the term of this patent is extended or adjusted under 35 U.S.C. 154(b) by 241 days.

(21) Appl. No.: 14/020,908

(22) Filed: Sep. 9, 2013

(65) Prior Publication Data

US 2014/0008653 A1    Jan. 9, 2014

Related U.S. Application Data

(63) Continuation-in-part of application No. 12/696,026, filed on Jan. 28, 2010, now Pat. No. 8,558,177.

(51) Int. Cl.
| | |
|---|---|
| *H01L 27/14* | (2006.01) |
| *H01L 27/146* | (2006.01) |
| *G01J 1/02* | (2006.01) |
| *G01J 1/08* | (2006.01) |
| *G01J 1/42* | (2006.01) |
| *H01L 27/144* | (2006.01) |
| *G01J 3/36* | (2006.01) |
| *G01J 5/08* | (2006.01) |

(52) U.S. Cl.
CPC ............. *H01L 27/14649* (2013.01); *G01J 1/02* (2013.01); *G01J 1/029* (2013.01); *G01J 1/08* (2013.01); *G01J 1/4204* (2013.01); *G01J 1/4228* (2013.01); *G01J 3/36* (2013.01); *H01L 27/1443* (2013.01); *G01J 5/0846* (2013.01); *H01L 27/14621* (2013.01); *H01L 27/14652* (2013.01)

(58) Field of Classification Search
CPC ..................... H01L 27/14621; H01L 27/14652
See application file for complete search history.

(56) References Cited

U.S. PATENT DOCUMENTS

| | | | |
|---|---|---|---|
| 4,651,001 A * | 3/1987 | Harada et al. ................. | 250/330 |
| 5,157,473 A | 10/1992 | Okazaki | |
| 5,449,924 A | 9/1995 | Hur et al. | |
| 5,981,950 A * | 11/1999 | Wolny et al. ............... | 250/338.4 |
| 6,373,117 B1 | 4/2002 | Theil | |

(Continued)

FOREIGN PATENT DOCUMENTS

| | | |
|---|---|---|
| TW | 200721522 | 6/2007 |
| WO | WO 2014204111 A1 * | 12/2014 |

*Primary Examiner* — Christine Sung
(74) *Attorney, Agent, or Firm* — Jianq Chyun IP Office (57) ABSTRACT

Provided is a multi-wave band light sensor combined with a function of infrared ray (IR) sensing including a substrate, an IR sensing structure, a dielectric layer, and a multi-wave band light sensing structure. The substrate includes a first region and a second region. The IR sensing structure is in the substrate for sensing IR. The dielectric layer is on the IR sensing structure. The multi-wave band light sensing structure includes a first wave band light sensor, a second wave band light sensor, and a third wave band light sensor. The second wave band light sensor and the first wave band light sensor are overlapped and disposed on the IR sensing structure on the first region of the substrate from the bottom up. The third wave band light sensor is in the dielectric layer of the second region.

21 Claims, 7 Drawing Sheets

(56) References Cited

U.S. PATENT DOCUMENTS

| | | |
|---|---|---|
| 6,875,975 B2 * | 4/2005 | Faska et al. ............ 250/214.1 |
| 7,592,593 B2 | 9/2009 | Kauffman et al. |
| 7,872,234 B2 | 1/2011 | Nam |
| 7,888,736 B2 | 2/2011 | Anderson et al. |
| 7,960,699 B2 | 6/2011 | Chang et al. |
| 2002/0025597 A1 | 2/2002 | Matsuda |
| 2003/0001093 A1 * | 1/2003 | Wood ........................ 250/332 |
| 2009/0200589 A1 | 8/2009 | Qian et al. |
| 2010/0225628 A1 | 9/2010 | Souchkov et al. |

* cited by examiner

MULTI-WAVE BAND LIGHT SENSOR COMBINED WITH FUNCTION OF IR SENSING AND METHOD OF FABRICATING THE SAME

CROSS-REFERENCE TO RELATED APPLICATION

This application is a continuation-in-part application of and claims the priority benefit of a prior application Ser. No. 12/696,026, filed on Jan. 28, 2010, now allowed. The prior application Ser. No. 12/696,026 claims the priority benefit of Taiwan application serial no. 98138507, filed on Nov. 12, 2009. The entirety of each of the above-mentioned patent applications is hereby incorporated by reference herein and made a part of this specification.

BACKGROUND OF THE INVENTION

1. Field of the Invention

The invention relates to a sensor and a method of fabricating the same, and more particularly, to a multi-wave band light sensor combined with a function of IR sensing and a method of fabricating the same.

2. Description of Related Art

In recent years, sensing devices have been playing important roles in most industrial applications and automated control uses. Sensing devices usually include temperature sensors, humidity sensors, pressure sensors, magnetic sensors, illumination sensors, distance sensors, and the like. Among these, ambient light sensors have been extensively applied in various consumer products with the popularization of liquid crystal display panels and various mobile devices (such as mobile phones, personal digital assistants (PDAs), global positioning systems (GPSs), notebooks, netbooks, and so on). Ambient light sensors are capable of sensing lights in the surrounding to adjust the screen brightness automatically so as to save power. However, these devices merely sense lights with a single wavelength, and the quantum efficiency has yet to be enhanced.

SUMMARY OF THE INVENTION

The invention provides a multi-wave band light sensor combined with a function of infrared ray (IR) sensing. The multi-wave band light sensor combined with a function of IR sensing can sense light source of a plurality of wave bands.

The invention provides a multi-wave band light sensor combined with a function of IR sensing. The multi-wave band light sensor combined with a function of IR sensing is integrated on the same chip.

The invention provides a multi-wave band light sensor combined with a function of IR sensing. The multi-wave band light sensor combined with a function of IR sensing has a relatively high quantum efficiency (QE) in the visible light wave band and is suitable for the needs of the multi-wave band light sensor for sensing wave bands.

The invention provides a method of fabricating a multi-wave band light sensor combined with a function of IR sensing. The method of fabricating a multi-wave band light sensor combined with a function of IR sensing has a simple process.

The invention provides a method of fabricating a multi-wave band light sensor combined with a function of IR sensing. The method of fabricating a multi-wave band light sensor combined with a function of IR sensing can reduce layout area and can reduce budget and time of the process of the filter, and thereby reduce the costs of materials and the process.

The invention provides a multi-wave band light sensor combined with a function of IR sensing. The multi-wave band light sensor combined with a function of IR sensing includes a substrate, an IR sensing structure, a dielectric layer, and a multi-wave band light sensing structure. The substrate includes a first region and a second region. The IR sensing structure is in the substrate for sensing IR. The dielectric layer is on the substrate and covers the IR sensing structure. The multi-wave band light sensing structure is on the substrate and includes a first wave band light sensor, a second wave band light sensor, and a third wave band light sensor. The first wave band light sensor is on the dielectric layer of the first region and corresponds to the IR sensing structure. The second wave band light sensor is in the dielectric layer of the first region. A first portion of the second wave band light sensor is overlapped with the IR sensing structure and the first wave band light sensor. The third wave band light sensor is in the dielectric layer of the second region.

The invention provides a method of fabricating a multi-wave band light sensor combined with a function of IR sensing. The method of fabricating a multi-wave band light sensor combined with a function of IR sensing includes forming an IR sensing structure in a first region of a substrate for sensing IR, forming a dielectric layer on the substrate, and forming a multi-wave band light sensing structure. The step of forming the multi-wave band light sensing structure further includes forming a first wave band light sensor on the dielectric layer of the first region of the substrate, and forming a second wave band light sensor in the dielectric layer of the first region of the substrate, and forming a third wave band light sensor in the dielectric layer of the second region of the substrate, wherein a first portion of the second wave band light sensor is overlapped with the IR sensing structure and the first wave band light sensor.

The multi-wave band light sensor combined with a function of IR sensing of the invention can sense light source of a plurality of wave bands.

The multi-wave band light sensor combined with a function of IR sensing of the invention is integrated on the same chip.

The multi-wave band light sensor combined with a function of IR sensing of the invention has a relatively high QE in the visible light wave band and is suitable for the needs of multi-wave band light sensing.

The method of fabricating a multi-wave band light sensor combined with a function of IR sensing of the invention has a simple process.

The method of fabricating a multi-wave band light sensor combined with a function of IR sensing of the invention can reduce layout area and can reduce budget and time of the process of the filter, and thereby reduce the costs of materials and the process.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
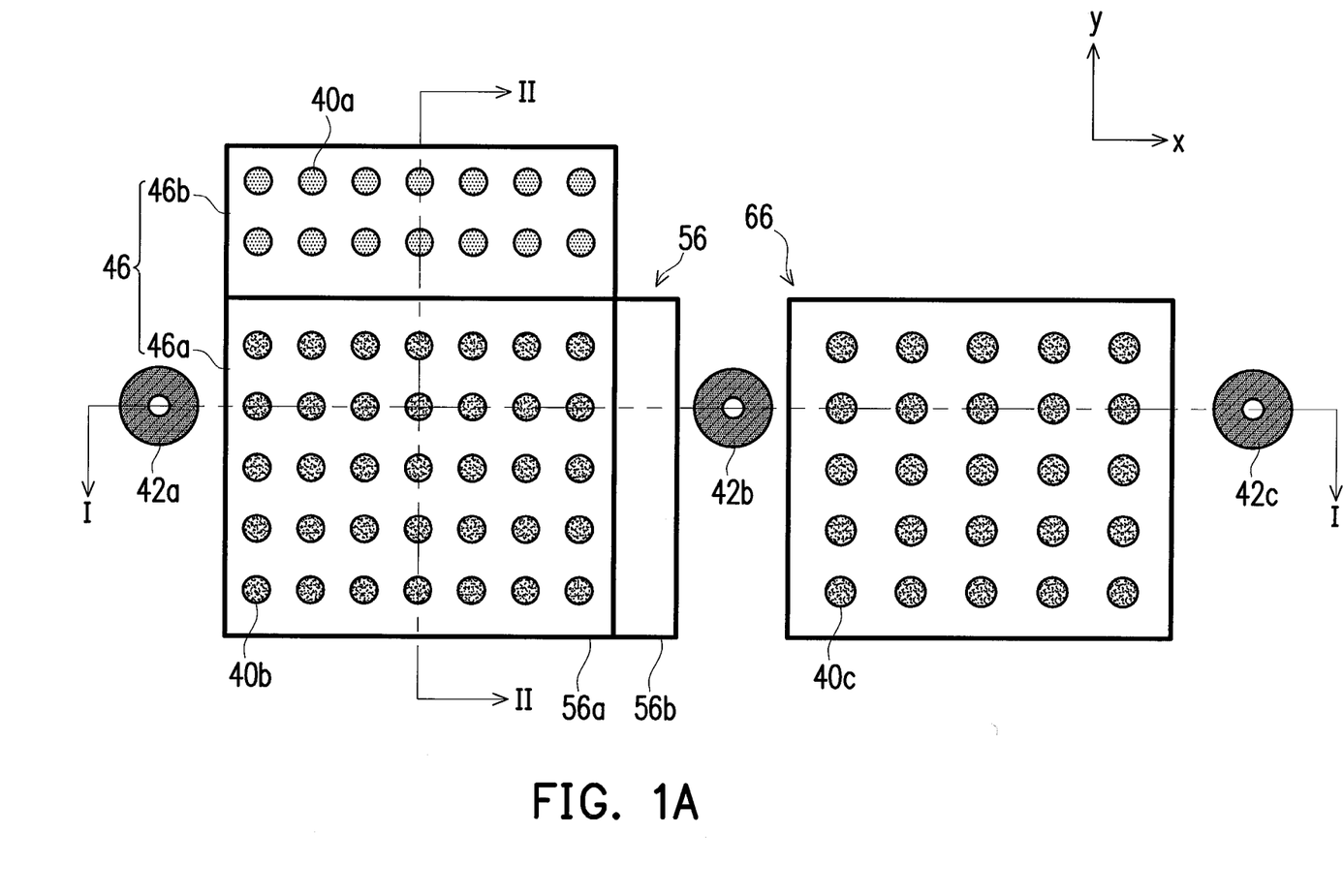
FIG. 1A is a partial top view of a multi-wave band light sensor combined with a function of infrared ray (IR) sensing illustrated according to an embodiment of the invention.
Figure 1B:
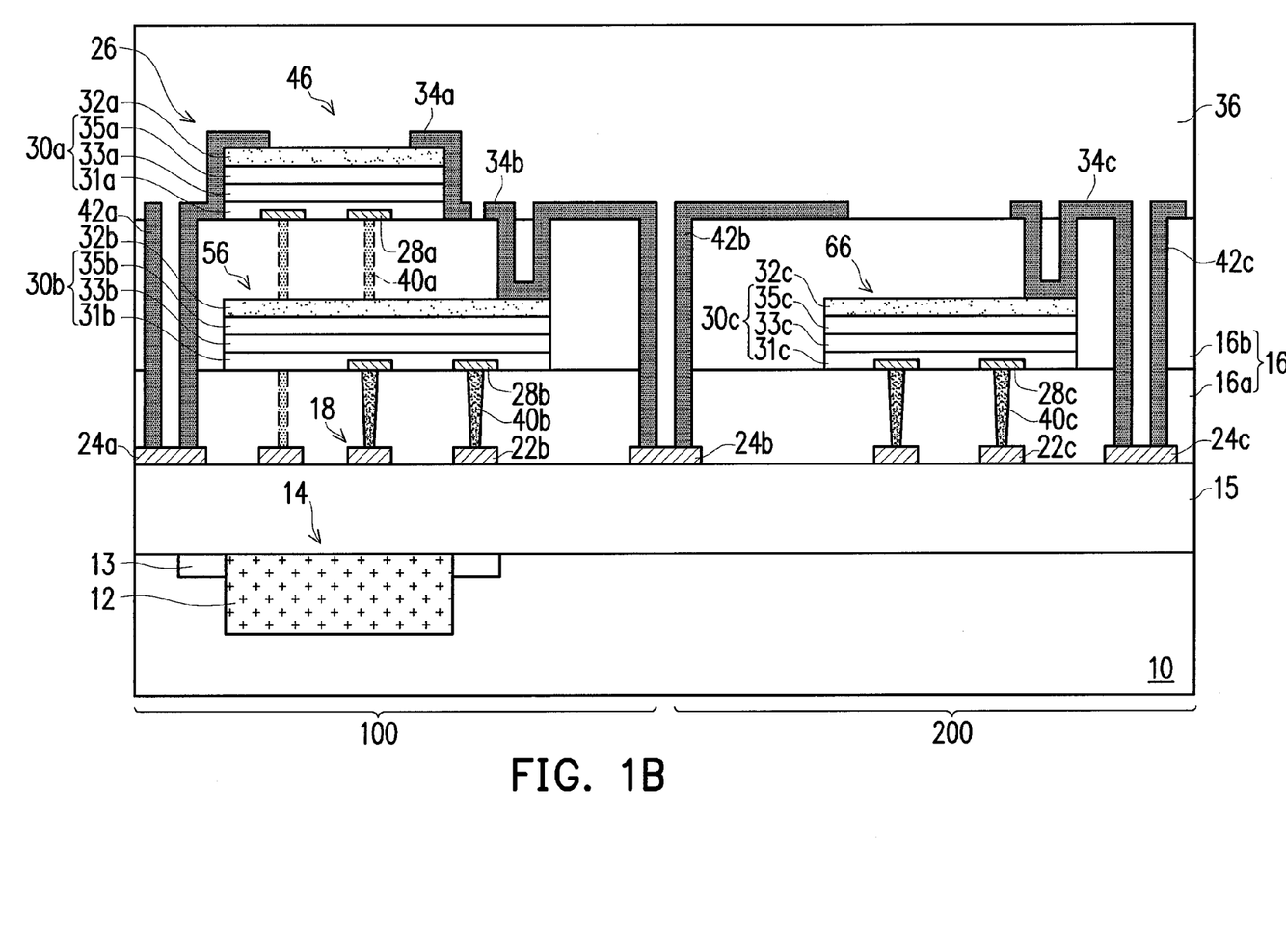
FIG. 1B illustrates a partial cross-sectional schematic diagram of the multi-wave band light sensor of IR sensing of FIG. 1A at the cutting-plane line I-I.
Figure 1C:
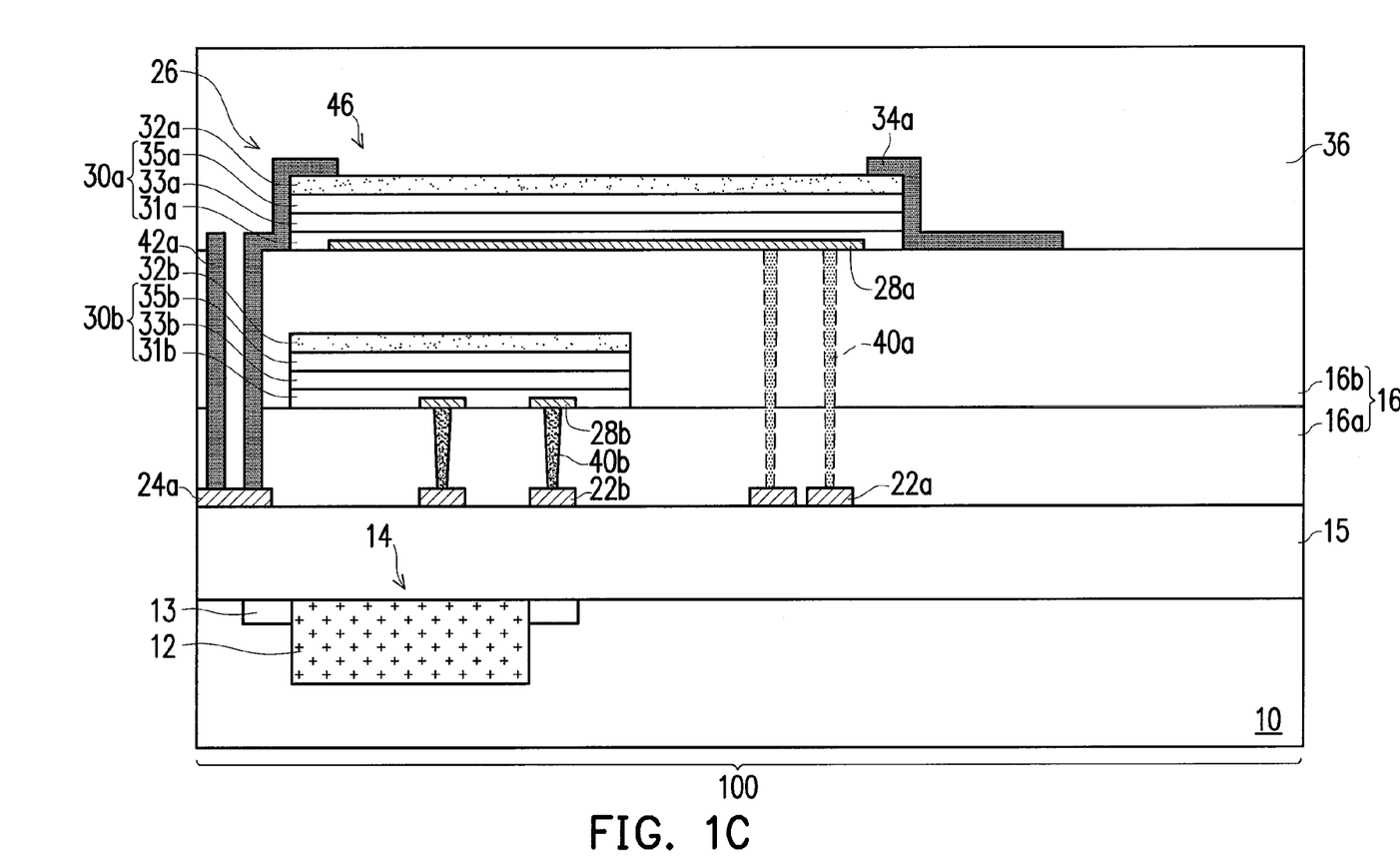
FIG. 1C illustrates a partial cross-sectional schematic diagram of the multi-wave band light sensor of IR sensing of FIG. 1A at the cutting-plane line II-II.

FIG. 1A is a partial top view of a multi-wave band light sensor combined with a function of infrared ray (IR) sensing illustrated according to an embodiment of the invention. FIG. 1B illustrates a partial cross-sectional schematic diagram of the multi-wave band light sensor of IR sensing of FIG. 1A at the cutting-plane line I-I. FIG. 1C illustrates a partial cross-sectional schematic diagram of the multi-wave band light sensor of IR sensing of FIG. 1A at the cutting-plane line II-II.

Referring to FIGS. 1A-1C, a substrate 10 is provided. The material of the substrate 10 is, for instance, a doped semiconductor such as a P-type silicon substrate, an N-type silicon substrate, or an undoped silicon substrate. The substrate 10 includes a first region 100 and a second region 200 adjacent to the first region 100. An isolation structure 13 is formed in the substrate 10. The isolation structure 13 can reduce noise interference. The isolation structure 13 is, for instance, a shallow trench isolation structure. Then, an IR sensing structure 14 is formed in the first region 100 of the substrate 10. The IR structure 14 is, for instance, a junction diode, and the method of forming the junction diode includes forming a well region 12 in the substrate 10, wherein the well region 12 is in contact with the substrate 10 and the conductivity type of the well region 12 is different from the conductivity type of the substrate 10. In an embodiment, the substrate 10 is a P-type silicon substrate 10 and the well region 12 is an N-type doped region. The method of forming the well region 12 includes, for instance, forming a mask layer on the substrate 10, then performing an ion implantation process to implant the dopant into the substrate 10 to form the well region 12, and then removing the mask layer. The P-type dopant of the ion implantation process is, for instance, boron, and the N-type dopant is, for instance, phosphorous or arsenic. In an embodiment, in addition to forming the IR sensing structure 14, a metal oxide semiconductor device such as an N-channel field effect transistor (NMOS), a P-channel field effect transistor (PMOS), or a complementary field effect transistor (CMOS) is further formed on the substrate 10. For simplicity, the devices are not illustrated and are covered by a dielectric layer 15. The material of the dielectric layer 15 is, for instance, silicon oxide, borophosphosilicate glass (BPSG), phosphosilicate glass (PSG), undoped silicon glass (USG), fluorosilicate glass (FSG), spin-on glass (SOG), or a low dielectric constant material with a dielectric constant lower than 4. The method of forming the dielectric layer 15 can be chemical vapor deposition (CVD) or a spin coating method.

Then, referring to FIGS. 1B-1C, a metal interconnect 18 is formed in the dielectric layer 15 and on the dielectric layer 15 on the substrate 10. The metal interconnect 18 includes top metal layers 22a, 22b, and 22c. In an embodiment, when forming the top metal layers 22a, 22b, and 22c of the metal interconnect 18, bonding pads 24a, 24b, and 24c are formed at the same time. In another embodiment, the level of each of the bonding pads 24a, 24b, and 24c can be different from the level of each of the top metal layers 22a, 22b, and 22c (not illustrated).

Then, referring to FIGS. 1B-1C, a dielectric layer 16a is formed on the substrate 10. The material of the dielectric layer 16a is, for instance, silicon oxide, BPSG, PSG, USG, FSG, SOG, or a low dielectric constant material with a dielectric constant lower than 4. The method of forming the dielectric layer 16a can be CVD or a spin coating method.

Then, referring to FIGS. 1B-1C, a dielectric layer 16b and a multi-wave band light sensor 26 are formed on the dielectric layer 16a. The multi-wave band light sensing structure 26 includes a first wave band light sensor 46, a second wave band light sensor 56, and a third wave band light sensor 66. The first wave band light sensor 46 and the second wave band light sensor 56 are on the first region 100 of the substrate 10. The second wave band light sensor 56 is between the first wave band light sensor 46 and the IR sensing structure 14. The third wave band light sensor 66 is on the second region 200 of the substrate 10 and on one side of the second wave band light sensor 56. In an embodiment, the three wave band light sensors 46, 56, and 66 can all sense the visible spectrum in the wavelength of 400 to 750 nm, wherein the first wave band light sensor 46 includes a high green light sensor, and the range of the sensible spectral peaks is in the wavelength of, for instance, 490 to 550 nm; the second wave band light sensor 56 includes a red light sensor, and the range of the sensible spectral peaks is in the wavelength of, for instance, 600 to 700 nm; and the third wave band light sensor 66 includes a high blue light sensor, and the range of the sensible spectral peaks is in the wavelength of, for instance, 450 to 480 nm.

Referring to FIGS. 1A-1B, the first wave band light sensor 46 is on the dielectric layer 16b on the second wave band light sensor 56 and completely covers the IR sensing structure 14. A portion 46a of the first wave band light sensor 46 is overlapped with the second wave band light sensor 56 below the first wave band light sensor 46, another portion 46b of the first wave band light sensor 46 is not overlapped with the second wave band light sensor 56 and extends to the outside of the second wave band light sensor 56 along a second direction (such as the y direction). The other portion 46b of the first wave band light sensor 46 is electrically connected to the top metal layer 22a of the metal interconnect 18 through a via 40a.

Referring to FIGS. 1A-1B, the second wave band light sensor 56 is between the first wave band light sensor 46 and the IR sensing structure 14, on the dielectric layer 16a, and covered by the dielectric layer 16b. The area of the second wave band light sensor 56 is greater than the area of the IR sensing structure 14 and completely covers the IR sensing structure 14. A portion 56a of the second wave band light sensor 56 is overlapped with the first wave band light sensor 46 on the second wave band light sensor 56, another portion 56b of the second wave band light sensor 56 is not overlapped with the first wave band light sensor 46 and extends to the outside of the first wave band light sensor 46 along a first direction (such as the x direction). The second wave band light sensor 56 is electrically connected to the top metal layer 22b of the metal interconnect 18 through a via 40b.

Referring to FIGS. 1A-1C, the third wave band light sensor 66 is on the second region 200 of the substrate 10, on the dielectric layer 16a, and completely covered by the dielectric layer 16b. In an embodiment, the third wave band light sensor 66 and the second wave band light sensor 56 can substantially be at the same level and adjacent to each other (as shown in FIG. 1B). In another embodiment, the third wave band light sensor 66 and the second wave band light sensor 56 can also be at different levels (not illustrated). The third wave band light sensor 66 is electrically connected to the top metal layer 22c of the metal interconnect 18 through a via 40c.

Referring to FIG. 1B, the first wave band light sensor 46, the second wave band light sensor 56, and the third wave band light sensor 66 respectively include, from the bottom up, lower electrodes 28a, 28b, and 28c, hydrogenated amorphous silicon layers 30a, 30b, and 30c, and transparent upper electrodes 32a, 32b, and 32c. The lower electrodes 28a, 28b, and 28c are respectively electrically connected to the vias 40a, 40b, and 40c of the metal interconnect 18. The hydrogenated amorphous silicon layers 30a, 30b, and 30c are respectively between the lower electrodes 28a, 28b, and 28c and the transparent upper electrodes 32a, 32b, and 32c. In an embodiment, each of the hydrogenated amorphous silicon layers 30a, 30b, and 30c is a stacked structure. Each of the stacked structures respectively includes hydrogenated amorphous silicon layers 31a, 31b, and 31c of the first conductivity type, intrinsic hydrogenated amorphous silicon layers 33a, 33b, and 33c, and hydrogenated amorphous silicon layers 35a, 35b, and 35c of the second conductivity type. The transparent upper electrodes 32a, 32b, and 32c respectively cover the hydrogenated amorphous silicon layers 30a, 30b, and 30c.

Referring to FIG. 1B, in an embodiment, the step of forming the multi-wave band light sensor 26 includes first forming the lower electrodes 28b and 28c on the dielectric layer 16a such that the lower electrodes 28b and 28c are electrically connected to the vias 40a, 40b, and 40c. The material of each of the lower electrodes 28b and 28c includes metal such as titanium nitride (TiN), tungsten (W), chromium (Cr), or aluminum (Al), and each of the methods of forming the lower electrodes 28b and 28c includes, for instance, depositing a lower electrode material layer using physical vapor deposition (PVD) or CVD, and then patterning the lower electrode material layer with a lithography process and an etching process. When the lower electrode 28 is a metal, the thickness thereof is very thin, such as 50 angstroms to 500 angstroms, such that IR can pass through.

Then, referring to FIG. 1B, the hydrogenated amorphous silicon layers 30b and 30c are formed on the lower electrodes 28b and 28c. In an embodiment, each of the hydrogenated amorphous silicon layers 30b and 30c is a stacked structure. Each of the stacked structures includes hydrogenated amorphous silicon layers 31b and 31c of the first conductivity type, intrinsic hydrogenated amorphous silicon layers 33b and 33c, and hydrogenated amorphous silicon layers 35b and 35c of the second conductivity type. Plasma enhanced CVD can be used for the method of deposition of each of the hydrogenated amorphous silicon layers 30b and 30c with $B_2H_6/H_2$ and $PH_3/H_2$ as reactive dopant gases, wherein the type or the concentration of the dopant and the parameter of the deposition process are changed during the deposition procedure to form the hydrogenated amorphous silicon layers 30b and 30c. The method of patterning of each of the hydrogenated amorphous silicon layers 30b and 30c is, for instance, a lithography process and an etching process.

In an embodiment, the second wave band light sensor 56 is an IR sensor, and the stacked structure of the hydrogenated amorphous silicon layer 30b thereof has a PIN structure. More specifically, the hydrogenated amorphous silicon layer 35b of the second conductivity type is P-type, the thickness thereof is, for instance, 50 angstroms to 500 angstroms, the concentration of the P-type dopant is, for instance, $1\times10^{19}$ to $1\times10^{22}$ atoms/cm$^3$, and the P-type dopant is, for instance, boron. The thickness of the intrinsic hydrogenated amorphous silicon layer 33b is, for instance, 500 angstroms to 5,000 angstroms. The hydrogenated amorphous silicon layer 31b of the first conductivity type is N-type, the thickness thereof is, for instance, 50 angstroms to 500 angstroms, the concentration of the N-type dopant is, for instance, $1\times10^{19}$ to $1\times10^{22}$ atoms/cm$^3$, and the N-type dopant is, for instance, phosphorous or arsenic.

The third wave band light sensor 66 is a high blue light sensor, and the stacked structure of the hydrogenated amorphous silicon layer 30c thereof also has a PIN structure. More specifically, the hydrogenated amorphous silicon layer 35c of the second conductivity type is P-type, the thickness thereof is, for instance, 50 angstroms to 500 angstroms, the concentration of the P-type dopant is, for instance, $1\times10^{19}$ to $1\times10^{22}$ atoms/cm$^3$, and the P-type dopant is, for instance, boron. The thickness of the intrinsic hydrogenated amorphous silicon layer 33c is, for instance, 500 angstroms to 5,000 angstroms. The hydrogenated amorphous silicon layer 31c of the first conductivity type is N-type, the thickness thereof is, for instance, 50 angstroms to 500 angstroms, the concentration of the N-type dopant is, for instance, $1\times10^{19}$ to $1\times10^{22}$ atoms/cm$^3$, and the N-type dopant is, for instance, phosphorous or arsenic.

Then, referring to FIG. 1B, the transparent upper electrodes 32b and 32c are respectively formed on the hydrogenated amorphous silicon layers 30b and 30c. The material of each of the transparent upper electrodes 32b and 32c includes transparent conductive oxide such as indium tin oxide, and the method of deposition is, for instance, a sputtering method. The thickness of each of the transparent upper electrodes 32b and 32c is, for instance, 500 to 5,000 angstroms.

The method of forming the hydrogenated amorphous silicon layers 30a and 30b (stacked structures) and the transparent upper electrodes 32b and 32c includes, for instance, depositing a stacked structure material layer and a transparent upper electrode material layer, and then performing a lithography process and an etching process to pattern the stacked structure material layer and the transparent upper electrode material layer. When the second wave band light sensor 56 and the third wave band light sensor 66 are at the same level, the second wave band light sensor 56 can be formed first and the third wave band light sensor 66 second. Alternatively, the third wave band light sensor 66 can also be formed first, followed by forming the second wave band light sensor 56.

Then, referring to FIG. 1B, the dielectric layer 16b is formed on the second wave band light sensor 56 and the third wave band light sensor 66. The dielectric layer 16b and the dielectric layer 16a form a dielectric layer 16. The material of the dielectric layer 16 can be the same or different as the material of the dielectric layer 16a. The material of the dielectric layer 16b is, for instance, silicon oxide, BPSG, PSG, USG, FSG, SOG, or a low dielectric constant material with a dielectric constant lower than 4. The method of forming the dielectric layer 16b can be CVD or a spin coating method.

Then, referring to FIG. 1C, the lower electrode 28a, the hydrogenated amorphous silicon layer 30a, and the transparent upper electrode 32a of the first wave band light sensor 46 are formed on the dielectric layer 16b. In particular, the method of forming the lower electrode 28a and the method of forming the transparent upper electrode 32a are as described above and are not repeated herein. The method of deposition of the hydrogenated amorphous silicon layer 30a is similar to the method of deposition of each of the hydrogenated amorphous silicon layers 30b and 30c, with minor differences. In an embodiment, the first wave band light sensor 46 is a high green light sensor, and the stacked structure of the hydrogenated amorphous silicon layer 30a thereof has a PIN structure. That is, the hydrogenated amorphous silicon layer 35a of the second conductivity type is P-type, the thickness thereof is, for instance, 50 angstroms to 500 angstroms, the concentration of the P-type dopant is, for instance, $1\times10^{19}$ to $1\times10^{22}$ atoms/cm$^3$, and the P-type dopant is, for instance, boron. The thickness of the intrinsic hydrogenated amorphous silicon layer 33a is, for instance, 500 angstroms to 5,000 angstroms. The hydrogenated amorphous silicon layer 31a of the first conductivity type is N-type, the thickness thereof is, for instance, 50 angstroms to 500 angstroms, the concentration of the N-type dopant is, for instance, $1\times10^{19}$ to $1>10^{22}$ atoms/cm$^3$, and the N-type dopant is, for instance, phosphorous or arsenic.

Then, referring to FIG. 1B, light-shielding layers 34a, 34b, and 34c are formed. The material of each of the light-shielding layers 34a, 34b, and 34c includes metal such as Al, TiN, W, or a black color filter. The light-shielding layer 34a covers the sidewall and the surrounding of the upper surface of the first wave band light sensor 46 and is electrically connected to the bonding pad 24a through a via 42a such that the leakage current from the sidewall of the first wave band light sensor 46 can be guided to the bonding pad 24a. The light-shielding layer 34b covers the dielectric layer 16b on the second wave band light sensor 56 not overlapped with the first wave band light sensor 46, extends to the dielectric layer 16b to be in contact with the surface of the second wave band light sensor 56, and is electrically connected to the bonding pad 24b through a via 42b. The light-shielding layer 34c covers the dielectric layer 16b on the edge of the third wave band light sensor 66, extends to the dielectric layer 16b to be in contact with the surface of the third wave band light sensor 66, and is electrically connected to the bonding pad 24c through a via 42c.

Then, referring to FIG. 1B, a protective layer 36 is formed on the substrate 10 and the protective layer 36 covers the multi-wave band light sensing structure 26. The material of the protective layer 36 is, for instance, polyimide.

The subsequent process includes cutting the substrate and packaging . . . etc. which are not described. After cutting and packaging, the multi-wave band light sensor combined with a function of IR sensing can be formed, wherein the IR sensor and the multi-wave band light sensor are integrated on the same chip for sensing light source of multi-wave bands.

Referring to FIG. 1B, in the embodiments above, the multi-wave band light sensor 26 is disposed on the top metal layers 22a, 22b, and 22c of the metal interconnect 18. However, in actual application, the configuration is not limited thereto. If process conditions allow, the multi-wave band light sensor 26 can also be disposed between any two metal layers of the metal interconnect 18.

Referring to FIGS. 1A and 1B, the multi-wave band light sensor combined with a function of IR sensing of the embodiments of the invention includes a substrate 10, an IR sensing structure 14, and a multi-wave band light sensing structure 26. The multi-wave band light sensing structure 26 includes a first wave band light sensor 46, a second wave band light sensor 56, and a third wave band light sensor 66. The IR sensing structure 14, the first wave band light sensor 46, and the second wave band light sensor 56 of the multi-wave band light sensing structure 26 are in a first region 100 of the substrate 10. A third wave band light sensor 66 of the multi-wave band light sensing structure 26 is in a second region 200 of the substrate 10. The IR sensing structure 14 is in the substrate 10 below the multi-wave band sensing structure 26 for sensing IR. The multi-wave band sensing structure 26 is on the substrate 10 for sensing and filtering light of three wave bands.

More specifically, the IR sensing structure 14 is, for instance, a junction diode formed by the substrate 10 and the well region 12 in the substrate 10 for sensing IR.

The second wave band light sensor 56 is between the first wave band light sensor 46 and the IR sensing structure 14. The third wave band light sensor 66 is on one side of the second wave band light sensor 56.

The first wave band light sensor 46, the second wave band light sensor 56, and the third wave band light sensor 66 respectively include, from the bottom up, lower electrodes 28a, 28b, and 28c, hydrogenated amorphous silicon layers 30a, 30b, and 30c, and transparent upper electrodes 32a, 32b, and 32c. The hydrogenated amorphous silicon layers 30a, 30b, and 30c are on the lower electrodes 28a, 28b, and 28c. The transparent upper electrodes 32a, 32b, and 32c cover the hydrogenated amorphous silicon layers 30a, 30b, and 30c. In an embodiment, each of the hydrogenated amorphous silicon layers 30a, 30b, and 30c is a stacked structure. Each of the stacked structures includes hydrogenated amorphous silicon layers 31a, 31b, and 31c of the first conductivity type on the lower electrodes 28a, 28b, and 28c, intrinsic hydrogenated amorphous silicon layers 33a, 33b, and 33c on the hydrogenated amorphous silicon layers 31a, 31b, and 31c of the first conductivity type, and hydrogenated amorphous silicon layers 35a, 35b, and 35c of the second conductivity type on the intrinsic hydrogenated amorphous silicon layers 33a, 33b, and 33c, wherein the first conductivity type is N-type and the second conductivity type is P-type. In an embodiment, the lower electrodes 28a, 28b, and 28c are electrically connected to the metal interconnect 18 in the dielectric layer 16 through vias 40a, 40b, and 40c. The first wave band light sensor 46, the second wave band light sensor 56, and the third wave band light sensor 66 of the multi-wave band sensing structure 26 are covered by light-shielding layers 34a, 34b, and 34c and are connected to bonding pads 24a, 24b, and 24c through vias 42a, 42b, and 42c such that the leakage current from each of the first wave band light sensor 46, the second wave band light sensor 56, and the third wave band light sensor 66 can be guided to the bonding pads 24a, 24b, and 24c.

When light passes through the first wave band light sensor 46 on the first region 100 of the substrate 10, the light is filtered, and light of the first wave band (such as high green light) can be sensed by the first wave band light sensor 46. As the filtered light progresses and passes through the dielectric layer 16b and reaches the second wave band light sensor 56, the light is filtered again, and light of the second wave band (such as red light) can be sensed by the second wave band light sensor 56. After being filtered twice, the light progresses to the IR sensing structure 14, and light of the IR wave band can be sensed by the IR sensing structure 14. When light passes through the third wave band light sensor 66 on the second region 200 of the substrate 10, the light is filtered, and light of the third wave band (such as high blue light) can be sensed by the third wave band light sensor 66.

In other words, the first region 100 of the substrate 10 can sense light of the first wave band (such as high green light), light of the second wave band (such as red light), and light of the IR wave band. The second region 200 of the substrate 10 can sense the light of the third wave band (such as high blue light). That is, the first region 100 of the substrate 10 can sense light of three wave bands, and the second region can sense light of a single wave band.

Figure 2:
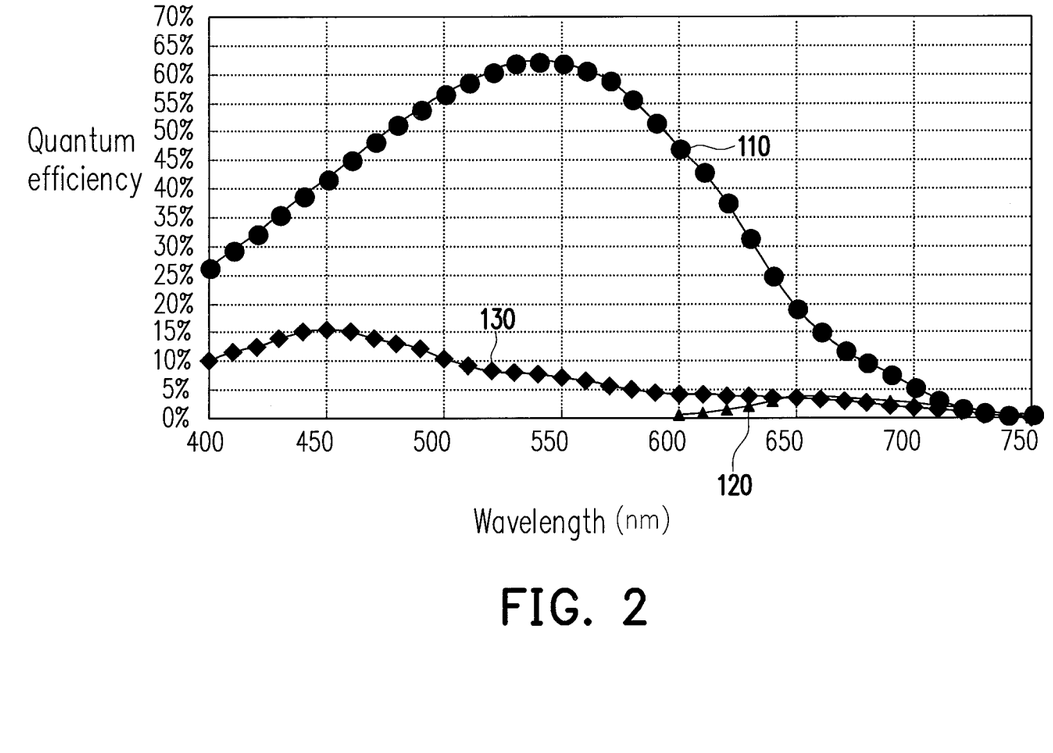
FIG. 2 illustrates three QE spectra of different wave bands sensed by a light sensor.

FIG. 2 illustrates three QE spectra of different wave bands sensed by a light sensor.

Referring to FIG. 2, the QE spectrum of light of the first wave band (such as high green light) sensed by the first wave band light sensor 46 is as shown by a curve 110, the QE spectrum of light of the second wave band (such as red light) sensed by the second wave band light sensor 56 is as shown by a curve 120, and the QE spectrum of light of the third wave band (such as high blue light) sensed by the third wave band light sensor 66 is as shown by a curve 130.

Figure 3:
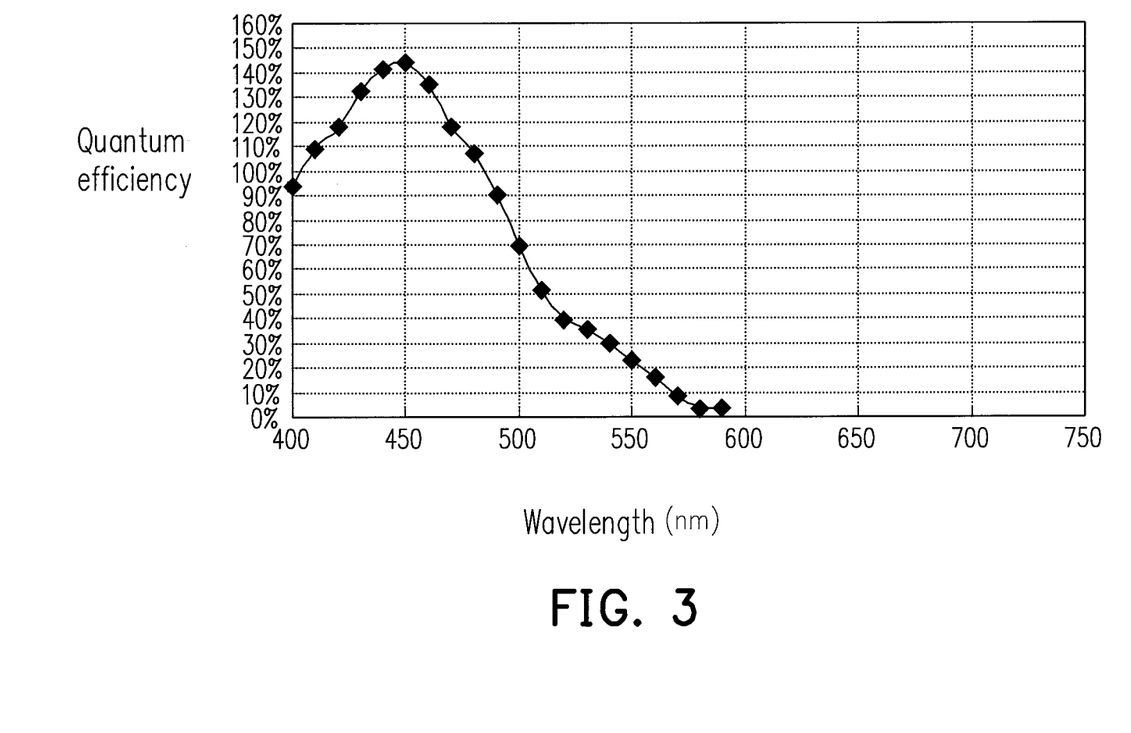
FIGS. 3-5 illustrate three QE spectra after circuit calculation.
Figure 4:
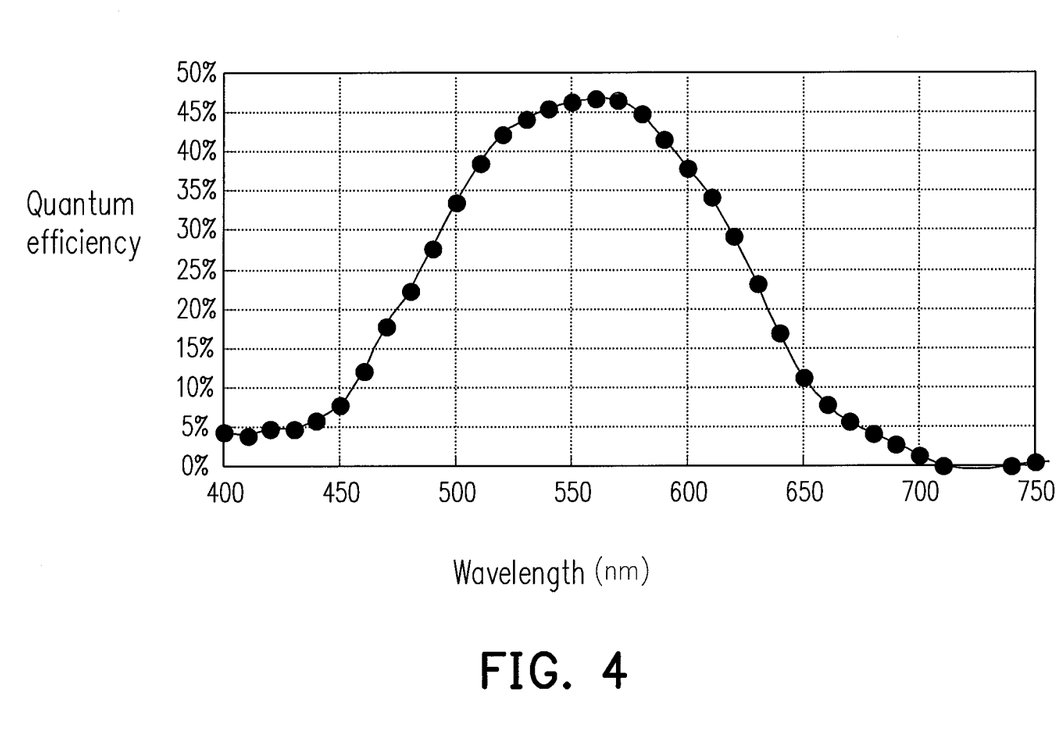
Figure 5:
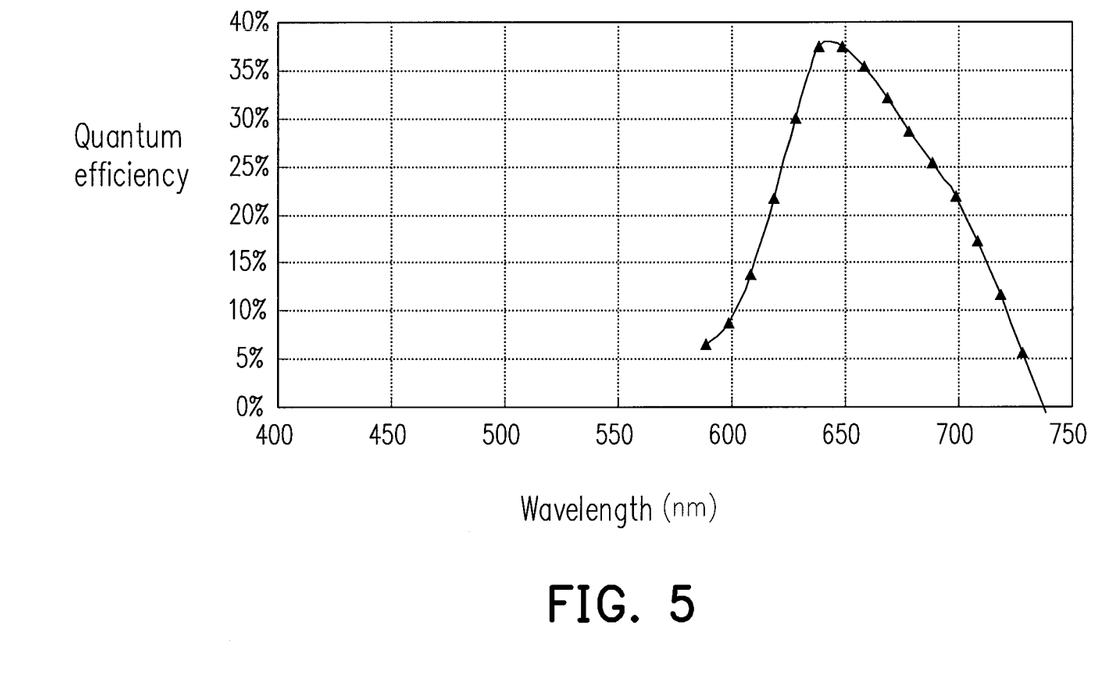

FIGS. 3-5 illustrate three QE spectra after circuit calculation.

Referring to FIGS. 3-5, the QE spectrum of the output of blue light (as shown in FIG. 3), the QE spectrum of the output of green light (as shown in FIG. 4), and the QE spectrum of the output of red light (as shown in FIG. 5) can be obtained after circuit calculation of the original sensing QE spectrum of light of the first wave band (such as high green light), the original sensing QE spectrum of light of the second wave band (such as red light), and the original sensing QE spectrum of light of the third wave band (such as high blue light) obtained by the first wave band light sensor 46, the second wave band light sensor 56, and the third wave band light sensor 66.

More specifically, the QE spectrum of the output of blue light of FIG. 3 can be obtained by multiplying the QE spectrum of original sensing (curve 130) of the light of the third wave band (such as high blue light) in FIG. 2 with a constant value A, and then subtracting the QE spectrum of original sensing (curve 110) of the light of the first wave band (such as high green light) in FIG. 2 from the product. The formula thereof is as shown in formula 1:

QE spectrum of output of blue light=(QE spectrum of original sensing of high blue light)×$A$–(QE spectrum of original sensing of high green light)  [formula 1]

In particular, A is a constant value allowing the obtained curve of the QE spectrum of blue light to be positive.

Similarly, the QE spectrum of the output of green light of FIG. 4 can be obtained by subtracting the QE spectrum of original sensing (curve 130) of light of the third wave band (such as high blue light) in FIG. 2 from the QE spectrum of original sensing (curve 110) of light of the first wave band (such as high green light) in FIG. 2, and then multiplying the result with a constant value B. The formula thereof is as shown in formula 2:

QE spectrum of output of green light=(QE spectrum of original sensing of high green light)–(QE spectrum of original sensing of high blue light)×$B$  [formula 2]

In particular, B is a constant value allowing the obtained curve of the QE spectrum of the output of green light to be positive.

The QE spectrum of the output of red light of FIG. 5 can be obtained by multiplying the QE spectrum of original sensing (curve 120) of light of the second wave band (such as red light) in FIG. 2 with a constant value C. The formula thereof is as shown in formula 3:

QE spectrum of output of red light=QE spectrum of original sensing of red light×$C$  [formula 3]

In particular, C is a constant value allowing the obtained curve of the QE spectrum of original sensing of red light to be positive.

Moreover, each of the first wave band light sensor 46, the second wave band light sensor 56, and the third wave band light sensor 66 can obtain a fixed current in a fixed visible wavelength range at a fixed light intensity after the multi-wave band light sensor combined with a function of IR sensing performs circuit calculation. For instance, when the photocurrent of each of green light, blue light, and red light is to be made consistent, the following can be obtained through the irradiation of white light at a fixed intensity:

constant current of each of the wave band light sensors

=[(current of high blue light–dark current of high blue light)×$A$]–[(current of high green light–dark current of high green light)]

=(current of high green light–dark current of high green light)–[(current of high blue light–dark current of high blue light)×$B$]

=[(current of red light–dark current of red light)×$C$]

In particular, A, B, and C need to satisfy the QE spectrum formulas of formula 1, formula 2, and formula 3 and the calculation conditions of the photocurrents at the same time. The photocurrent of each of the three light sources (green light, blue light, and red light) can be adjusted according to different needs and configurations in response to the needs of various circuit designs.

Based on the above, the invention integrates the function of each of the multi-wave band light sensor and the IR sensor on the same chip. The multi-wave band light sensing structure 26 in the sensor can sense light of a plurality of wave bands such as high green light, high blue light, and red light. Moreover, the multi-wave band light sensing structure in the sensor can also be used as the filter of visible light for the IR sensor below the multi-wave band light sensing structure. As a result, additional filters of the IR sensor do not need to be formed, and therefore the process is simple, and the layout area can be reduced. Moreover, budget and time of the process of the filter can be reduced, and as a result the costs of materials and the process are low.

Moreover, the invention provides a multi-wave band light sensor combined with a function of IR sensing. The multi-wave band light sensor combined with a function of IR sensing uses hydrogenated amorphous silicon as the multi-wave band light sensing structure. The multi-wave band light sensor combined with a function of IR sensing has a relatively high QE in the visible light wave band and is very suitable for the needs of the multi-wave band Eight sensor for sensing wave bands. Moreover, the multi-wave band light sensor combined with a function of IR sensing of the embodiments of the invention can be integrated with a semiconductor process.

Although the invention has been described with reference to the above embodiments, it will be apparent to one of the ordinary skill in the art that modifications and variations to the described embodiments may be made without departing from the spirit and scope of the invention. Accordingly, the scope of the invention will be defined by the attached claims not by the above detailed descriptions.

What is claimed is:

1. A multi-wave band light sensor combined with a function of infrared ray (IR) sensing, comprising:
   a substrate comprising a first region and a second region;
   an IR sensing structure in the substrate for sensing IR;
   a dielectric layer on the substrate and covering the IR sensing structure; and
   a multi-wave band light sensing structure on the substrate, comprising:
      a first wave band light sensor on the dielectric layer of the first region and corresponding to the IR sensing structure;
      a second wave band light sensor in the dielectric layer of the first region, wherein a first portion of the second wave band light sensor is overlapped with the IR sensing structure and the first wave band light sensor; and a third wave band light sensor in the dielectric layer of the second region.

2. The multi-wave band light sensor combined with a function of IR sensing of claim 1, wherein the first wave band light sensor comprises a high green light sensor, the second wave band light sensor comprises a red light sensor, and the third wave band light sensor comprises a high blue light sensor.

3. The multi-wave band light sensor combined with a function of IR sensing of claim 1, wherein the first wave band light sensor, the second wave band light sensor, and the third wave band light sensor respectively comprise:
a lower electrode;
a hydrogenated amorphous silicon layer covering the lower electrode; and
a transparent upper electrode covering the hydrogenated amorphous silicon layer.

4. The multi-wave band light sensor combined with a function of IR sensing of claim 3, wherein each of the hydrogenated amorphous silicon layers is a stacked structure comprising:
a hydrogenated amorphous silicon layer of a first conductivity type on the lower electrode;
an intrinsic hydrogenated amorphous silicon layer on the hydrogenated amorphous silicon layer of the first conductivity type; and
a hydrogenated amorphous silicon layer of a second conductivity type on the intrinsic hydrogenated amorphous silicon layer, wherein the first conductivity type is N-type and the second conductivity type is P-type.

5. The multi-wave band light sensor combined with a function of IR sensing of claim 3, wherein a material of the transparent upper electrode comprises transparent conductive oxide and a material of the lower electrode comprises metal.

6. The multi-wave band light sensor combined with a function of IR sensing of claim 1, wherein the second wave band light sensor and the third wave band light sensor are at a same level.

7. The multi-wave band light sensor combined with a function of IR sensing of claim 1, wherein the second wave band light sensor and the third wave band light sensor are at a different level.

8. The multi-wave band light sensor combined with a function of IR sensing of claim 1, wherein the second wave band light sensor and the third wave band light sensor are on a plurality of top metal layers of a plurality of metal interconnects and each of the lower electrodes is electrically connected to each of the corresponding metal interconnects.

9. The multi-wave band light sensor combined with a function of IR sensing of claim 8, wherein the first wave band light sensor completely covers the IR sensing structure, a second portion of the first wave band light sensor is not overlapped with the second wave band light sensor, and the second portion is electrically connected to one of the top metal layers through a via.

10. The multi-wave band light sensor combined with a function of IR sensing of claim 1, further comprising a plurality of light-shielding layers covering a surrounding of an upper surface of each of the first wave band light sensor, the second wave band light sensor, and the third wave band light sensor, and each of the light-shielding layers is respectively electrically connected to a bonding pad.

11. The multi-wave band light sensor combined with a function of IR sensing of claim 10, wherein a level of the second wave band light sensor is greater than a level of the bonding pad.

12. The multi-wave band light sensor combined with a function of IR sensing of claim 1, wherein the IR sensing structure comprises a well region in the substrate, the well region is in contact with the substrate, a conductivity type of the well region is different from a conductivity type of the substrate, and the well region and the substrate form a junction diode.

13. A method of fabricating a multi-wave band light sensor combined with a function of IR sensing, comprising:
forming an IR sensing structure in a first region of a substrate for sensing IR;
forming a dielectric layer on the substrate; and
forming a multi-wave band light sensing structure, comprising:
forming a first wave band light sensor on the dielectric layer of the first region of the substrate; and
forming a second wave band light sensor in the dielectric layer of the first region of the substrate and forming a third wave band light sensor in the dielectric layer of a second region of the substrate, wherein a first portion of the second wave band light sensor is overlapped with the IR sensing structure and the first wave band light sensor.

14. The method of claim 13, wherein the first wave band light sensor comprises a high green light sensor, the second wave band light sensor comprises a red light sensor, and the third wave band light sensor comprises a high blue light sensor.

15. The method of claim 13, wherein a method of forming the first wave band light sensor, a method of forming the second wave band light sensor, and a method of forming the third wave band light sensor respectively comprise:
forming a lower electrode;
forming a hydrogenated amorphous silicon layer covering the lower electrode; and
forming a transparent upper electrode on the hydrogenated amorphous silicon layer.

16. The method of claim 15, wherein each of the hydrogenated amorphous silicon layers is a stacked structure, a method of forming the stacked structures comprising:
forming a hydrogenated amorphous silicon layer of a first conductivity type on the lower electrode;
forming an intrinsic hydrogenated amorphous silicon layer on the hydrogenated amorphous silicon layer of the first conductivity type; and
forming a hydrogenated amorphous silicon layer of a second conductivity type on the intrinsic hydrogenated amorphous silicon layer, wherein the first conductivity type is N-type and the second conductivity type is P-type.

17. The method of claim 15, wherein a material of the transparent upper electrode comprises transparent conductive oxide and a material of the lower electrode comprises metal.

18. The method of claim 13, further comprising forming a plurality of vias and a plurality of metal interconnects in the dielectric layer, wherein the lower electrodes are respectively electrically connected to each of the metal interconnects through the corresponding vias.

19. The method of claim 18, wherein a second portion of the first wave band light sensor is not overlapped with the second wave band light sensor, and the second portion is electrically connected to a top metal layer through one of the vias.

20. The method of claim 13, further comprising respectively forming a light-shielding layer on each of the first wave band light sensor, the second wave band light sensor, and the third wave band light sensor and in a surrounding of each thereof, and each of the light-shielding layers is connected to a bonding pad.

21. The method of claim 13, wherein a method of forming the IR sensing structure comprises forming a well region in the substrate, wherein the well region is in contact with the substrate, a conductivity type of the well region is different from a conductivity type of the substrate, and the well region and the substrate form a junction diode.

* * * * *

UNITED STATES PATENT AND TRADEMARK OFFICE
CERTIFICATE OF CORRECTION

PATENT NO. : 9,136,301 B2  
APPLICATION NO. : 14/020908  
DATED : September 15, 2015  
INVENTOR(S) : Jin-Wei Chang, Hung-Lung Wang and Jung-Kai Hung Page 1 of 1

It is certified that error appears in the above-identified patent and that said Letters Patent is hereby corrected as shown below:

On the title page of the patent grant, the item (30) Foreign Priority Application Data
--November 12, 2009 (TW)..... 98138507-- should be shown.

Signed and Sealed this
Ninth Day of February, 2016

Michelle K. Lee
*Director of the United States Patent and Trademark Office*